US006985098B2

(12) United States Patent
Lee

(10) Patent No.: US 6,985,098 B2
(45) Date of Patent: Jan. 10, 2006

(54) ANALOG FRONT END CIRCUIT AND METHOD OF COMPENSATING FOR DC OFFSET IN THE ANALOG FRONT END CIRCUIT

(75) Inventor: Yong-Hee Lee, Yongin-si (KR)

(73) Assignee: Samsung Electronics Co., Ltd., (KR)

( * ) Notice: Subject to any disclaimer, the term of this patent is extended or adjusted under 35 U.S.C. 154(b) by 12 days.

(21) Appl. No.: 10/844,750

(22) Filed: May 13, 2004

(65) Prior Publication Data

US 2005/0017883 A1    Jan. 27, 2005

(30) Foreign Application Priority Data

Jul. 23, 2003    (KR) .................... 10-2003-0050692

(51) Int. Cl.
*H03M 1/10*    (2006.01)
(52) U.S. Cl. ................. 341/120; 341/118; 341/126
(58) Field of Classification Search ............... 341/120, 341/144, 145, 155, 156, 161, 126, 110, 118
See application file for complete search history.

(56) References Cited

U.S. PATENT DOCUMENTS 5,789,974 A * 8/1998 Ferguson et al. ............ 330/2

6,100,827 A * 8/2000 Boesch et al. ............ 341/118
6,313,769 B1 * 11/2001 Mangahas et al. .......... 341/118
6,756,924 B2 * 6/2004 Lee et al. .................. 341/120
2002/0033891 A1    3/2002 Ying et al. .................. 348/241

FOREIGN PATENT DOCUMENTS

JP    2002-217730    8/2002

* cited by examiner

*Primary Examiner*—John B Nguyen
(74) *Attorney, Agent, or Firm*—Mills & Onello LLP

(57) ABSTRACT

DC offset is compensated for in an analog front end (AFE) circuit having an amplifier and an analog-to-digital converter (ADC). First data processed by the ADC are low pass filtered and estimated DC offset data of the ADC are obtained in ADC DC offset calibration mode. Second data processed by the ADC and the amplifier are low pass filtered, and a first DC offset of the ADC are substantially removed from the filtered second data by subtracting the estimated DC offset data from the filtered second data, thereby obtaining second compensated DC offset data of the amplifier in an amplifier DC offset calibration mode. The second compensated DC offset data is iteratively improved and first compensated DC offset data of the amplifier are obtained. The first compensated DC offset data are transformed into an analog signal, and the analog signal is subtracted from an input signal of the amplifier during operation mode.

20 Claims, 6 Drawing Sheets

ANALOG FRONT END CIRCUIT AND METHOD OF COMPENSATING FOR DC OFFSET IN THE ANALOG FRONT END CIRCUIT

CROSS-REFERENCE TO RELATED APPLICATIONS

This application relies for priority upon Korean Patent Application No. 2003-50692 filed on Jul. 23, 2003, the contents of which are herein incorporated by reference in their entirety.

BACKGROUND OF THE INVENTION

1. Field of the Invention

The present invention relates to an analog front end (AFE) circuit and to a method of compensating for DC offset in the analog front end circuit. More particularly, the present invention relates to an analog front end (AFE) circuit and a method of compensating for DC offset in the analog front end circuit in a manner that eliminates the undesired DC offset in a high-precision system.

2. Description of the Related Art

Analog systems and digital systems are commonly implemented in an integrated circuit using system on-chip (SOC) technology. Such systems commonly include an analog front end (AFE) circuit. The analog front end (AFE) circuit operates as an interface between an external input terminal, through which analog signals are input, and a digital signal processing unit that processes the received signals in digital format.

The analog front end (AFE) circuit includes an amplifier and an analog-to-digital converter (ADC). The amplifier amplifies the received analog signals, and the ADC converts the amplified analog signals into digital signals.

The AFE circuit is widely used in various devices, such as down converters for wireless digital communication devices, digital image scanners, digital cameras and voice codecs, and the like. The voice codec device is commonly used in wired or wireless telephone and digital answering machines for transmitting and recording voice data and music data.

Audio devices and video devices generally require high precision and low power consumption. Recently, multi-function voice codec has been developed and is applied to various applications as wired systems and wireless systems become increasingly integrated, and as communication systems and broadcasting systems become increasingly integrated.

In voice applications, the AFE circuit requires high resolution and low bandwidth operation. Thus, the AFE circuit adopts oversampling techniques and noise shaping technology for voice applications. In addition, the AFE circuit commonly provides a programmable gain function and a programmable attenuation function so as to interface with various input/output devices such as microphones and speakers, and the like.

The AFE circuit includes the ADC unit for processing digital signals in the rear stage of the AFE circuit. However, the analog input signals have various amplitudes depending upon the application. When the analog input signal has a small amplitude and the analog input signal is not amplified, the voltage level of an input signal input into the ADC is small, thus the ADC may not provide adequate conversion capabilities. For this reason, an amplifier is disposed in the front end of the ADC.

However, when the amplifier amplifies other, undesired, signals during the amplification operation, the ADC does not provide a desired conversion result, and a large amount of noise is therefore generated in the system having the AFE circuit. For example, in the case where the analog signal has a DC component and an AC component, the AC characteristics of the system, such as SNR (Signal to Noise Ratio), are enhanced only when the AC component is amplified and the DC component is not amplified. When the DC component signal is also amplified, the AFE circuit may operate abnormally, since the operation condition of the rear stage of the AFE circuit may be changed. Harmonic distortion may occur because signals may be clipped when the rear stage of the AFE circuit does not operate within the normal operational range.

Therefore, it is desirous to minimize the DC component of the signal that is amplified by the amplifier of the AFE circuit, in order to minimize the change in the operation condition of the rear stage of the AFE circuit.

FIG. 1 is a schematic view showing a conventional analog front end (AFE) circuit.

Referring to FIG. 1, the AFE circuit 10 includes a subtractor 12, an amplifier 14, an analog-to-digital converter (ADC) 14, a quantizer 18 and an offset compensation circuit 20.

According to the conventional AFE circuit 10, the DC offset of the amplifier 14 is added to the DC offset of the ADC 16, and then the resulting undesired DC offset is compensated. Thus, the undesired DC offset has large value. The conventional AFE circuit requires operation within preferred conditions (or range) and within preferred circuit characteristics in order to compensate for the large value of the undesired DC offset.

In addition, since the DC offset of the amplifier 14 is added to the DC offset of the ADC 16, the combined DC offsets of the amplifier 14 and the ADC 16 are compensated for at the same time. Thus, it is difficult to precisely compensate for the undesired DC offset, and thus, the conventional AFE circuit may not be applicable to use in systems requiring high-precision operation.

In addition, when external noise signals are input to the AFE circuit of FIG. 1, or when the AFE circuit has operational characteristics that are sensitive to the noise signals, the ADC 16 converts the signals having the noise signals into digital data, the digital data is fed back through the quantizer 18 and offset compensation circuit 20 to subtractor 12 and then is amplified by the amplifier 14. Thus, the result of the DC offset compensation may be worsened.

SUMMARY OF THE INVENTION

Accordingly, the present invention provides an apparatus and method that substantially obviate one or more of the limitations and disadvantages of the conventional approach.

According to embodiments of the present invention, there is provided an analog front end circuit in which undesired DC offset may be reduced or removed.

According to other embodiments of the present invention, there is provided a method of compensating for undesired DC offset in the analog front end circuit.

In some exemplary embodiments, the present invention provides a method of compensating for DC offset in an analog front end circuit having an amplifier and an analog-to-digital converter.

In one aspect, the method comprises performing a first calibration operation using first data processed by the analog-to-digital converter to obtain estimated DC offset data of the analog-to-digital converter when the analog front end circuit operates in a first mode for calibrating a first DC offset of the analog-to-digital converter; performing a second calibration operation using second data processed by the analog-to-digital converter and the amplifier, the first DC offset of the analog-to-digital converter being substantially removed from the second data by subtracting the estimated DC offset data of the analog-to-digital converter from the second data so that second compensated DC offset data of the amplifier are obtained, when the analog front end circuit operates in a second mode for calibrating a second DC offset of the amplifier; iteratively adjusting a value of the second compensated DC offset data of the amplifier to obtain first compensated DC offset data of the amplifier; and transforming the first compensated DC offset data into an analog compensated DC offset signal to subtract the analog compensated DC offset signal from an input signal of the amplifier when the analog front end circuit operates in a third mode.

In one embodiment, the estimated DC offset data of the analog-to-digital converter represents an average value of at least two first data. The step of iteratively adjusting a value of the second compensated DC offset data to obtain first compensated DC offset data comprises: quantizing the second compensated DC offset data of the amplifier to generate a sign bit; generating the first compensated DC offset data of the amplifier based on a value of the sign bit; and repeating the second calibrating operation to generate the first compensated DC offset data of the amplifier so that a value of a DC offset data of the amplifier is within the range of a minimum value. The second calibrating operation may optionally be performed using a digital successive approximation algorithm.

In another embodiment, the digital successive approximation algorithm is performed by: setting an initial value of an n-bit compensation code representing the second compensated DC offset data of the amplifier as initial compensation data, the initial value having a most significant bit; and iteratively changing a value of a successive adjacent next-most-significant bit of the initial compensation data, depending on whether the sign bit has a positive or negative value, until the value of the DC offset of the amplifier is within the range of the minimum value. In one embodiment, the second compensated DC offset data of the amplifier is represented by $2^n$ values such that the second compensated DC offset data of the amplifier has a resolution of $2^n$, in which n denotes a natural number, where $2^n$ is greater than or equal to a maximum value of the DC offset data of the amplifier.

In another embodiment, the first data are low pass filtered in the first mode, and the second data are low pass filtered in the second mode.

In another aspect, the present invention provides a method of compensating for DC offset in an analog front end circuit having an amplifier and an analog-to-digital converter. The method includes: a) low pass filtering data processed by both the analog-to-digital converter and the amplifier to obtain first DC offset data; b) removing a DC offset value of the analog-to-digital converter from the first DC offset data to generate second compensated DC offset data; c) generating a sign bit based on the second DC offset data; d) setting an initial value of a n-bit compensation code representing the second compensated DC offset data of the amplifier as initial compensation data; e) iteratively changing a value of a successive adjacent next-most-significant bit of the initial compensation data, depending on whether the sign bit has a positive or negative value; f) converting an approximated DC offset of the amplifier into an analog feed back signal, the approximated DC offset of the amplifier being obtained through step e); g) subtracting the analog feed back signal from an input signal of the amplifier; and h) repeating step a) step through step g) to obtain first compensated DC offset data of the amplifier until a value of the DC offset of the amplifier is within the range of a minimum value.

In one embodiment, the generating a sign bit based on the second DC offset data includes: selecting one of the first DC offset data and the second DC offset data; and generating the sign bit based on the selected DC offset data.

In another embodiment, the method is automatically performed when a power voltage signals is initially applied to the analog front end circuit.

In another aspect, the present invention is directed to an analog front end circuit. An amplifier circuit is configured to amplify an input signal that is compensated using an analog compensated DC offset signal, the input signal being an analog input signal when the analog front end circuit operates in an operation mode, and the input signal being a first reference voltage signal when the analog front end circuit operates in a calibration mode, the amplifier circuit having a first DC offset. An analog-to-digital converter circuit is configured to convert an output signal of the amplifier circuit into first digital data in the operation mode and to convert a second reference voltage signal into second digital data in the calibration mode, the analog-to-digital converter circuit having a second DC offset. A digital low pass filter is configured to filter an output signal of the analog-to-digital converter circuit to substantially remove high frequency components of the output signal of the analog-to-digital converter circuit. A digital-to-analog converter is configured to convert first compensated DC offset data into the analog compensated DC offset signal to provide the amplifier circuit with the analog compensated DC offset signal. A DC offset compensator is configured to select one of the operation mode and the calibration mode, configured to receive an output digital data of the digital low pass filter, and in response to the output digital data of the digital low pass filter, compensating for the first and second DC offset to generate the first compensated DC offset data, and configured to provide the digital-to-analog converter with the first compensated DC offset data.

In one embodiment, the amplifier circuit includes: a first switch that is configured to select the analog input signal in the operation mode and to select the reference voltage signal in the calibration mode; a first subtractor that is configured to subtract the analog compensated DC offset signal from an output signal of the first switch; and an amplifier that is configured to amplify an output signal of the first subtractor, the amplifier having the first DC offset.

In another embodiment, the analog-to-digital converter circuit includes: a second switch that is configured to select an output signal of the amplifier in the operation mode and to select the reference voltage signal in the calibration mode; and an analog-to-digital converter that is configured to convert an output signal of the second switch into the first or the second digital data.

The DC offset compensator may optionally include: a quantizer that is configured to quantize the output digital data of the digital low pass filter to generate a sign bit; a compensation data generator that is configured to generate the first compensated DC offset data based on the sign bit; and a controller that is configured to control the amplifier circuit and the analog-to-digital converter circuit so that the amplifier circuit and the analog-to-digital converter circuit select one of the operation mode and the calibration mode.

The DC offset compensation circuit may further include: an ADC DC offset generator that is configured to extract the second DC offset of the analog-to-digital converter circuit from the output digital data of the digital low pass filter, and configured to estimate the second DC offset of the analog-to-digital converter circuit to generate estimated DC offset data of the analog-to-digital converter circuit; a second subtractor that is configured to substantially remove the second DC offset of the analog-to-digital converter circuit from the output digital data of the digital low pass filter by subtracting the estimated DC offset data from the output digital data of the digital low pass filter to generate second compensated DC offset data; and a third switch that is configured to select one of the output digital data of the digital low pass filter and the second compensated DC offset data to provide the compensation data generator with the output digital data of the digital low pass filter or the second compensated DC offset data.

In another embodiment, the estimated DC offset data output from the ADC DC offset generator represents an average value of at least two output digital data of the digital low pass filter. The compensation data generator sets an initial value of a n-bit compensation code representing second compensated DC offset data of the amplifier as initial compensation data, the initial value having a most significant bit; and iteratively changes a value of a successive adjacent next-most-significant bit of the initial compensation data, depending on whether the sign bit has a positive or negative value, until the value of the DC offset of the amplifier is within the range of a minimum value.

BRIEF DESCRIPTION OF THE DRAWINGS

The above and other features and advantages of the present invention will become more apparent by describing in detail exemplary embodiments thereof with reference to the accompanying drawings, in which.

DETAILED DESCRIPTION OF EMBODIMENTS

Figure 1:
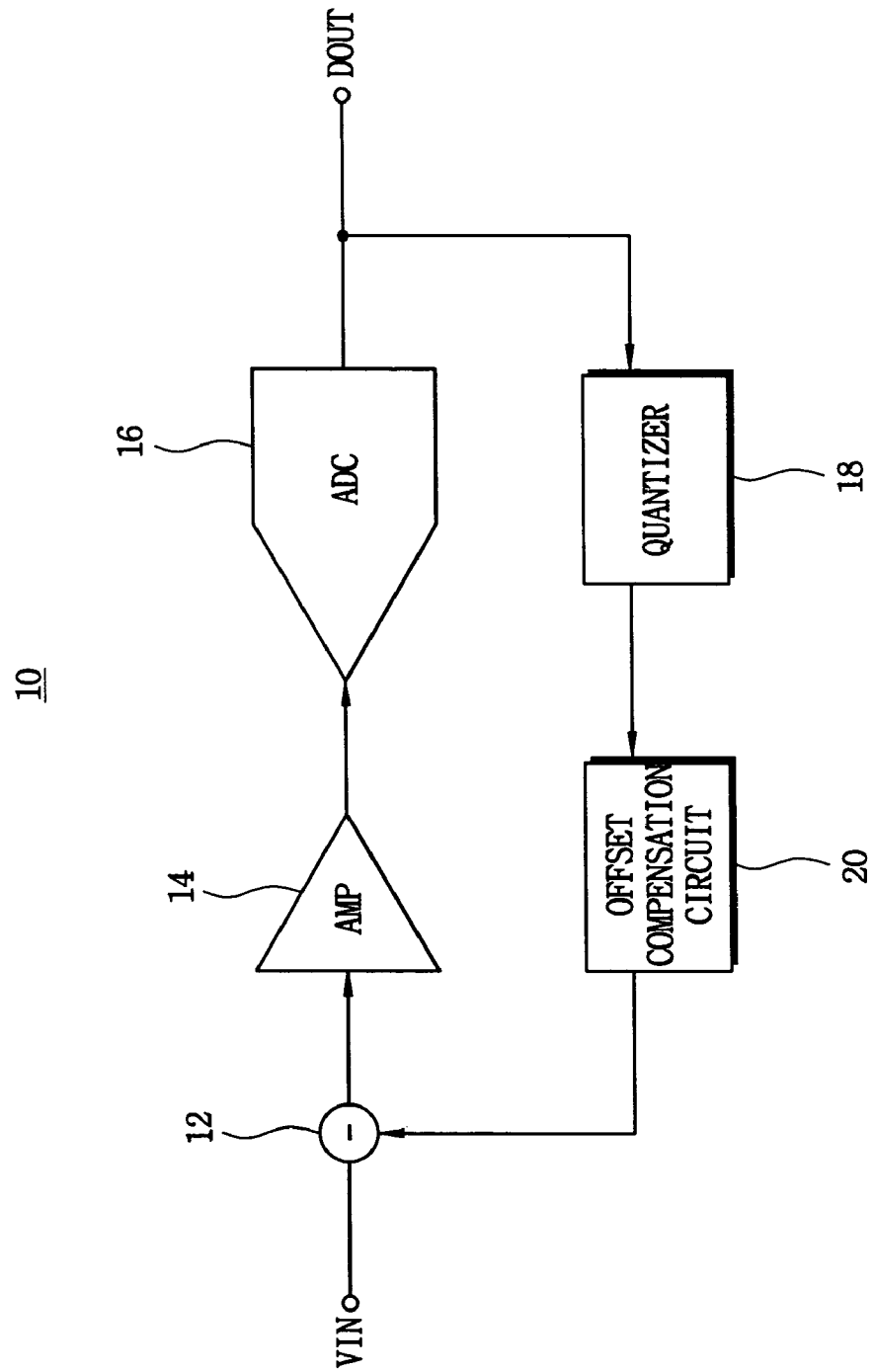
FIG. 1 is a schematic view of a conventional analog front end (AFE) circuit.

Detailed illustrative embodiments of the present invention are disclosed herein. However, specific structural and functional details disclosed herein are merely representative for the purpose of describing exemplary embodiments of the present invention. This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but, to the contrary, the invention covers all modifications, equivalents, and alternatives falling within the spirit and scope of the invention. Like numbers refer to like elements throughout the description of the figures. It should also be noted that in some alternative implementations, the functions/operations noted may occur out of the order noted in the flow diagrams. For example, two blocks shown in succession may in fact be executed substantially concurrently or the blocks may be executed in the reverse order, depending upon the functionality/operations involved.

Figure 2:
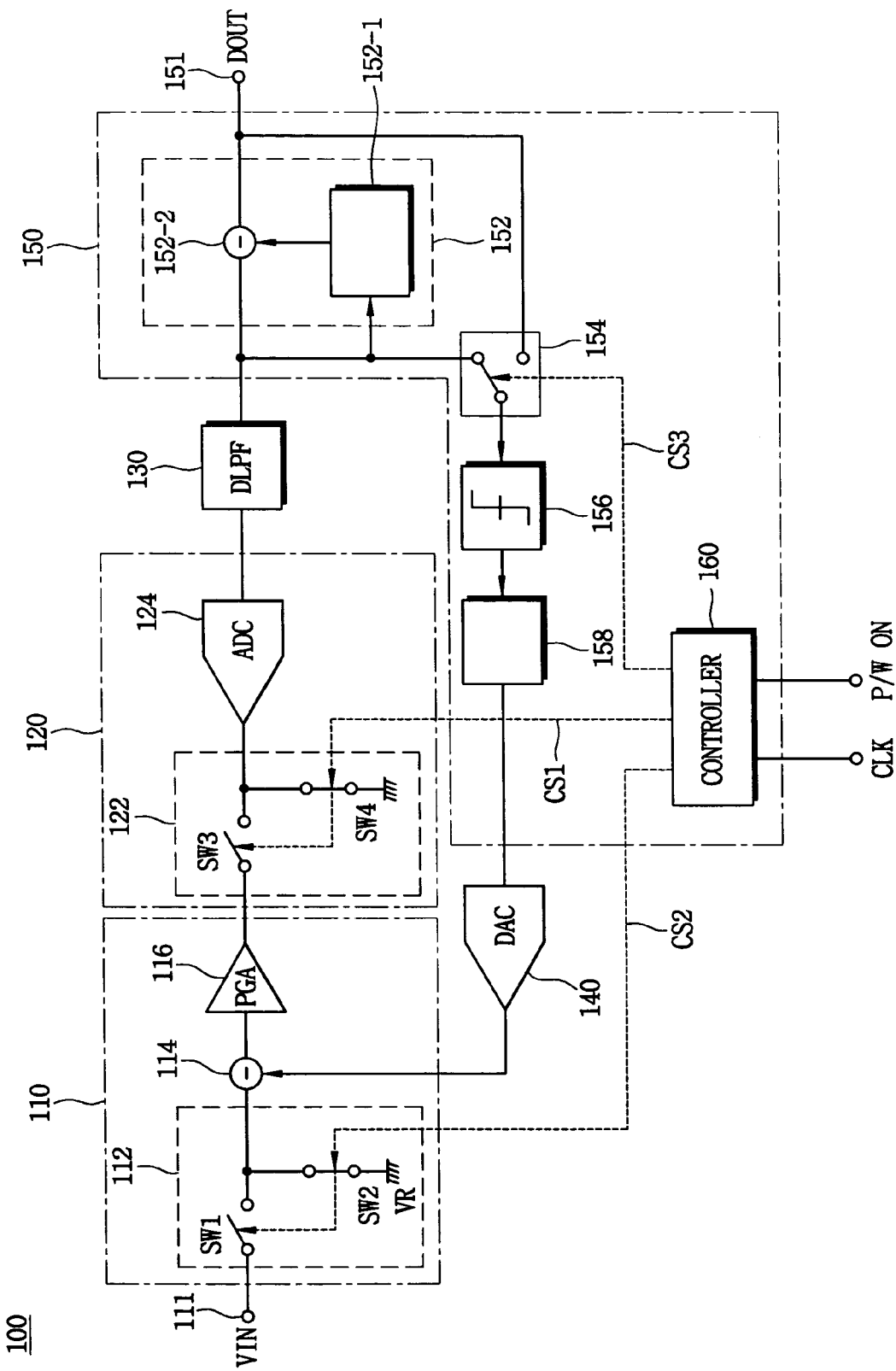
FIG. 2 is a circuit diagram of an analog front end circuit according to an exemplary embodiment of the present invention.

FIG. 2 is a circuit diagram showing an analog front end (AFE) circuit 100 according to one exemplary embodiment of the present invention.

Referring to FIG. 2, the AFE circuit 100 includes an amplifier circuit 110, an ADC circuit 120, a digital low pass filter 130, a digital-to-analog converter (DAC) and a DC offset compensation circuit 150.

The amplifier circuit 110 includes a first switch 112, a first subtractor 114 and programmable gain amplifier (PGA) 116. The first switch 112 includes switches SW1 and SW2. The switch SW1 is connected between an analog input terminal 111 and a first input terminal of the subtractor 114. The switch SW2 is connected between a reference voltage VR and a second input terminal of the subtractor 114. For example, the reference voltage VR is a ground potential. The switches SW1 and SW2 are switched in response to a second mode control signal CS2 output from the DC offset compensation circuit 150. For example, switch SW1 is turned on in an operation mode, and turned off in a calibration mode, while switch SW2 is turned off in the operation mode, and turned on in the calibration mode.

Thus, an analog input signal VIN is transmitted to the subtractor 114 via switch SW1 in the operation mode, and the reference voltage VR is transmitted to the subtractor 114 via switch SW2 in the calibration mode.

The subtractor 114 subtracts an analog compensated DC offset signal input to the second terminal of the subtractor 114 from a signal input to the first input terminal of the subtractor 114 via the switch SW1. The analog compensated DC offset signal is output by the DAC 140. Thus, the subtractor 114 outputs a compensated DC offset signal, and the compensated DC offset signal is input to an input terminal of the PGA 116. The PGA 116 has a first DC offset. The first DC offset is referred to as an internal DC offset of the PGA 116 when the reference voltage VR, for example ground voltage, is input to the input terminal of the PGA 116.

The ADC circuit 120 includes a second switch 122 and an analog-to-digital converter (ADC) 124. The second switch 122 includes switches SW3 and SW4. The switch SW3 is connected between an output terminal of the PGA 116 and an input terminal of the ADC 124. The switch SW4 is connected between the reference voltage VR and the input terminal of the subtractor 114. The switches SW3 and SW4 are switched in response to a first mode control signal CS1 output from the DC offset compensation circuit 150. For example, switch SW3 is turned on in the operation mode, and turned off in the calibration mode, while switch SW4 is turned off in the operation mode, and turned on in the calibration mode.

Thus, an output signal of the PGA 116 is transmitted to the ADC 124 via switch SW3 in the operation mode, and the reference voltage VR, for example the ground voltage, is transmitted to the ADC 124 via switch SW4 in the calibration mode.

In one example, the ADC 124 includes a delta-sigma-delta modulator. The ADC 124 has a second DC offset. The second DC offset is referred to as an internal DC offset of the ADC 124 when the reference voltage VR, for example ground voltage, is input to the input terminal of the ADC 124.

The digital low pass filter (DLPF) 130, for example, includes a Sinc filter. The digital low pass filter 130 low-pass filters the output signal of the ADC 124 to substantially remove high frequency components of the output signal of the ADC 124, which may be generated at the ADC 124 due to the "signal clipping" phenomenon.

The DAC 140 receives compensated DC offset data from the DC offset compensation circuit 150, and converts the compensated DC offset data into analog-compensated DC offset signals, and provides the converted signal to the second input terminal of the subtractor 114 as the analog compensated DC offset signal.

The DC offset compensation circuit 150 includes an ADC DC offset generator 152-1 and a second subtractor 152-2. The ADC DC offset generator 152-1 extracts the second DC offset of the ADC 124 from the output digital data of the digital low pass filter 130, and estimates the second DC offset of the ADC 124, to generate estimated DC offset data of the ADC 124. At least two output digital data elements (or low pass filtered ADC DC offset data) of the digital low pass filter 130 are sampled in a constant time interval, and the estimated DC offset data output from the ADC DC offset generator 152-1 represents an average value of the sampled at least two output digital data (or low pass filtered ADC DC offset) of the digital low pass filter 130. The sampling time interval and/or the sampling frequency may be adjustably varied, as needed, depending on the application. The estimated DC offset data may be stored at a register, for example present in the offset generator 152-1. The second subtractor 152-2 substantially removes the second DC offset of the ADC 124 from the output digital data of the digital low pass filter 130 by subtracting the estimated DC offset data from the output digital data of the digital low pass filter 130 to generate second compensated DC offset data. The second subtractor 152-2 provides an output signal to an output terminal (DOUT) 151 of the AFE circuit 100 as the second compensated DC offset data.

A first terminal of the third switch 154 is connected to an output terminal of the digital low pass filter 130, a second terminal of the third switch 154 is connected to an output terminal of the second subtractor 150-2, and a common terminal of the third switch 154 is connected to the quantizer 156. Therefore, the third switch 154 connects the common terminal to the second terminal in a high precision mode to transmit the second compensated DC offset data, in which the ADC DC offset is substantially removed, to the quantizer 156. The third switch 154 connects the common terminal to the first terminal in a coarse precision mode to transmit the output digital data, which includes the ADC DC offset, of the digital low pass filter 130, to the quantizer 156. Namely, the third switch 154 selects one of the output digital data of the digital low pass filter 130 and the second compensated DC offset data to provide the quantizer 156 with the output digital data of the digital low pass filter 130 or the second compensated DC offset data.

The quantizer 156 quantizes digital data input to the quantizer 156 to generate a sign bit. For example, in the calibration mode, the quantizer 156 generates a sign bit having a logical '1' when a value of the digital data input to the quantizer 156 represents negative (−) DC offset, and generates a sign bit having a logical '0' when a value of the digital data input to the quantizer 156 represents positive (+) DC offset.

The compensation data generator 158 generates first compensated DC offset data, in which the value of the first DC offset of the amplifier (or the PGA 116) is approximated to a minimum value, based on the sign bit according to digital successive approximation (DSA) algorithm. For example, the compensation data generator 158 includes a Digital Successive Approximation Register (DSAR).

Hereinafter, the digital successive approximation (DSA) process is described.

When an input range of an amplifier is 'X' and a DC offset range is 'X/2', the resulting range of compensated DC offset data of the amplifier is 'X/2'. For example, when 'X/2' is represented by 6 bits of compensation code comprised of b5, b4, b3, b2, b1 and b0, the maximum value of 'X/2' is $111111_{(2)}$, and the middle value of 'X/2' is $100000_{(2)}$. The 6 bit compensation code represents the compensated DC offset data of the amplifier.

In one example, the compensation data generator 158 sets a middle value $100000_{(2)}$ of the 6 bit compensation code as the initial compensation data. The compensation data generator 158 stores the middle value $100000_{(2)}$ in a register. The data stored in the register is provided to the DAC 140, are converted into an analog compensated DC offset signal, and the analog compensated DC offset signal is provided to the first subtractor 114.

When the DC offset of the amplifier is $-111001_{(2)}$ (or −57), the fed back sign bit generated by the quantizer 156 has the logical value of '1'. The compensated DC offset data of the amplifier are increased so as to compensate for the DC offset of the amplifier.

For example, the most significant bit (MSB) (b5) of the initial compensation data $100000_{(2)}$ is maintained and a value of a bit (b4) adjacent to the most significant bit (MSB) (b5) of the initial compensation data $100000_{(2)}$ is changed to a logical '1'; thus, the compensation code becomes $110000_{(2)}$ (48).

The feedback loop is repeated as described above so as to eventually obtain the final compensated DC offset data of the amplifier as described above. Table 1 shows the final compensated DC offset data of the amplifier when the DC offset of the amplifier is $-111001_{(2)}$ (or −57).

TABLE 1

| loop count | sign bit | compensated DC offset data b5b4b3b2b1b0 |
|---|---|---|
| Initial | | $100000_{(2)}(32)$ |
| 1 | 1 | $110000_{(2)}(48)$ |
| 2 | 1 | $111000_{(2)}(56)$ |
| 3 | 1 | $111100_{(2)}(60)$ |
| 4 | 0 | $111010_{(2)}(58)$ |
| 5 | 0 | $111001_{(2)}(57)$ |

As shown in table 1, when the loop count is 3, the compensated DC offset data is larger than the absolute value of the DC offset (−57), and the sign bit represents a positive value and has the logical '0' at the loop count 4. Since the sign bit is logical '0', the bit b2 is changed to '0' and the next bit b1 is changed to '1' so as to decrease the compensated DC offset data.

The compensated DC offset data may be stored in the register each time, and the stored compensated DC offset data is changed based on the fed back sign bit.

Table 2 shows the final compensated DC offset data of the amplifier when the DC offset of the amplifier is $+010111_{(2)}$ (or 23). When the DC offset of the amplifier has a positive value, the fed back sign bit generated by the quantizer 156 has the logical '1', and the compensation data is increased at the outset.

TABLE 2

| loop count | sign bit | compensated DC offset data b5b4b3b2b1b0 |
|---|---|---|
| Initial |   | $100000_{(2)}(32)$ |
| 1 | 0 | $010000_{(2)}(16)$ |
| 2 | 1 | $011000_{(2)}(24)$ |
| 3 | 0 | $010100_{(2)}(20)$ |
| 4 | 1 | $010110_{(2)}(22)$ |
| 5 | 1 | $010111_{(2)}(23)$ |

The resulting compensated DC offset data of the amplifier thus becomes (−23), as obtained through the DSA process described above.

The controller 160 receives a clock signal CLK to generate mode control signals (CS1, CS2 and CS3) and control signals (not shown) for controlling the amplifier circuit 110 and the analog-to-digital converter circuit 120, etc. in response to a power-on signal (P/W ON). In this manner, the AFE circuit performs the calibration mode automatically in response to the power on signal (P/W ON) to obtain the compensated DC offset data. In addition, the controller 160 may receive/transmit data from/to an external system via a serial port. For example, the data may include a PGA gain control value, compensated DC offset data, mode selection instructions, and the like.

Figure 3:
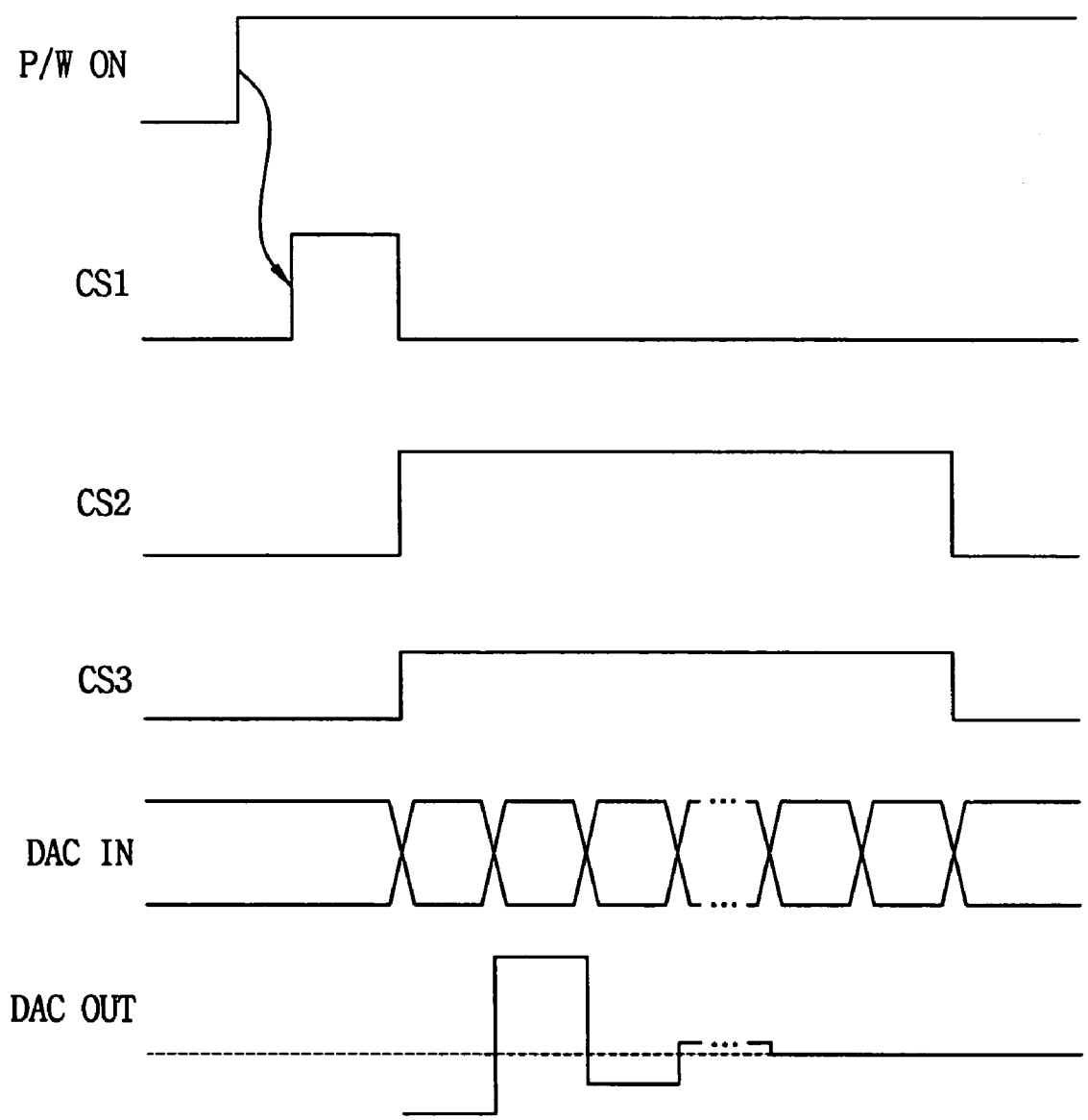
FIG. 3 is a timing diagram illustrating the operation of the analog front end circuit of FIG. 2 according to the exemplary embodiment of the present invention.
Figure 4A:
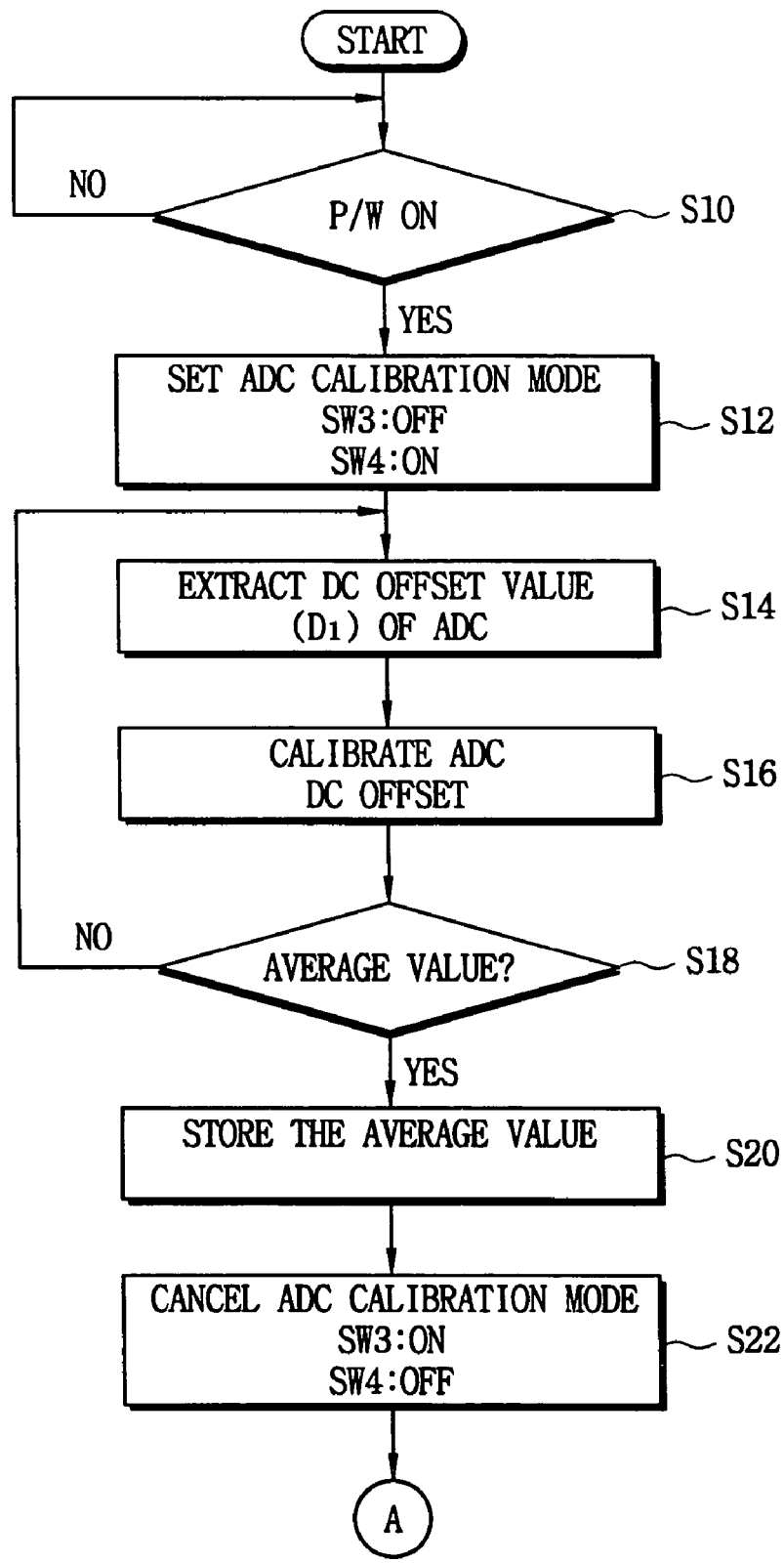
FIGS. 4A and 4B are flow diagrams illustrating the operation of the analog front end circuit of FIG. 2 according to an exemplary embodiment of the present invention.
Figure 4B:
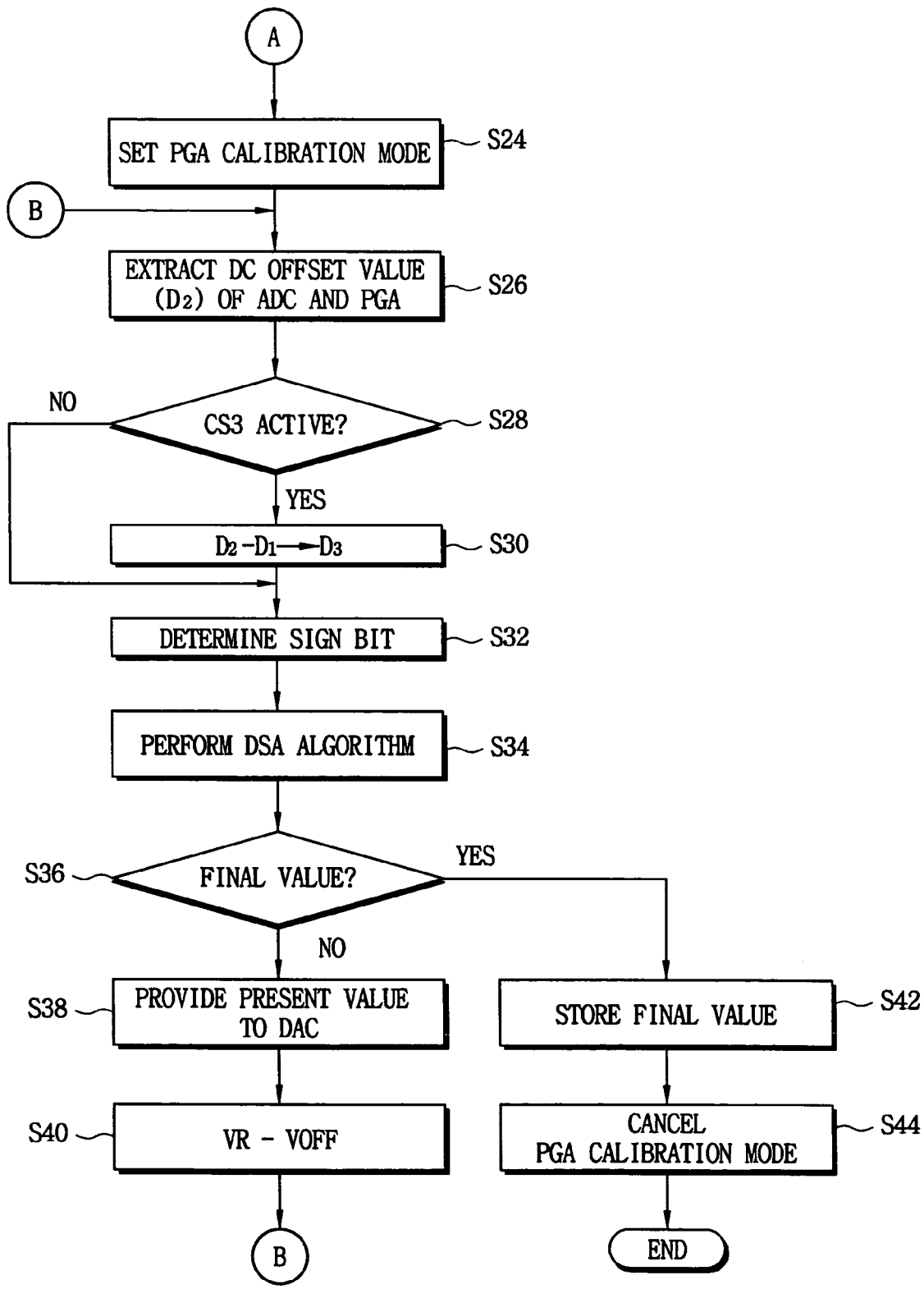

FIG. 3 is a timing diagram showing the operation of the analog front end circuit 100 of FIG. 2 according to an exemplary embodiment of the present invention, and FIGS. 4A and 4B are flow charts showing the operation of the analog front end circuit 100 of FIG. 2 according to an exemplary embodiment of the present invention.

Referring to FIGS. 3, 4A and 4B, the controller 160 detects the power-on status (step S10). When the power-on status is active, as shown in FIG. 3, the controller 160 sets the CS1 signal to active status and sets an ADC calibration mode (step S12). Thus, when SW3 is turned off and SW4 is turned on in the ADC calibration mode, the input terminal of the ADC 124 is coupled to a DC level, the reference voltage VR, and the reference voltage VR is converted into a digital data by the ADC 124. When the ADC 124 has no DC offset, the digital data has zero. When the ADC 124 has some DC offset, the digital data has a corresponding positive or negative value. The digital data are input to the digital low pass filter 130, and the digital low pass filter 130 low pass filters the high frequency noise of the output signal of the ADC 124, and/or filters other high frequency noise affecting the AFE circuit 100, and a DC value (D1) is extracted from the output signal of the ADC 124 (step S14).

Therefore, the output signal of the ADC 124 is not directly used as the DC offset value, however, noise is substantially removed from the output signal of the ADC 124 by the digital low pass filter, and thus, an exact DC offset value may be measured for the ADC 124.

The DC offset value of the ADC 124 is calibrated by repeating the above measuring process at least two times so that an average value of the DC offset values is obtained (step S16 and S18). The average value of the DC offset values is stored in a register (step S20). When the CS1 signal is changed to a non-active status, the ADC calibration mode is cancelled (step S22). Thus, SW3 is turned on, SW4 is turned off, and the output terminal of the PGA 116 is coupled to the input terminal of the ADC 124.

When the ADC calibration mode ends, the controller 160 generates the CS2 mode control signal at an active status to set PGA calibration mode, and the SW1 is turned off and SW2 is turned on (step S24). The PGA 116 has a DC value, i.e. the internal DC offset value of the PGA 116, in the PGA calibration mode. The internal DC offset value of the PGA 116 is converted into digital data by the ADC 124, filtered by the digital low pass filter 130, and a DC offset value (D2) of both the ADC 124 and the PGA 116 is extracted (step S26).

In ideal operating conditions, the output of the digital low pass filter 130 has a DC zero level, i.e. '0'. However, when offset errors are present, the output of the digital low pass filter 130 has positive or negative values, instead of '0'. The DC offset value (D2) includes the DC offset value of the PGA 116 and the DC offset value of the ADC 124.

The controller 160 generates a CS3 mode control signal having an active status (step S28). The CS3 signal has the active status while operating in the high precision mode, and has the non-active status while operating in the coarse mode. The switch 154 is coupled to the output terminal of the subtractor 152-2 while in the high precision mode. In the high precision mode, the average DC offset of the ADC 124 stored in the register is subtracted from the DC offset value (D2) by the subtractor 152-2, and thus the signal presented to the quantizer 156 includes the DC offset value (D3) of the PGA (step S28 and S30). Thus, while in the high-precision mode, the DC offset value of the PGA 116 is input to the quantizer 156. When the CS3 signal has a non-active status in step S28, the unit is operating in a coarse mode, and the signal presented to the quantizer 156 includes the DC offset value of the ADC 124 and the DC offset value of the PGA 116. In the coarse mode, the DC offset value of the ADC 124 and the DC offset value of the PGA 116 are input to the quantizer 156.

The output of the switch 154 is quantized by the quantizer 156. The quantizer 156 determines the sign bit based on the measured DC offset value (step S32). The measured DC offset value represents the DC offset value of the ADC 124 and the DC offset value of the PGA 116 in the coarse mode, and represents the DC offset value of the PGA 116 in the high precision mode.

The digital successive approximation (DSA) algorithm is performed so as to compensate for the DC offset value (step S34). When the sign bit is a value of '0', the DC offset value has a positive value, and thus the DC offset value is decreased according to the digital successive approximation (DSA) algorithm. When the sign bit has a value of '1', the DC offset value has a negative value, and thus the DC offset value is increased according to the digital successive approximation (DSA) algorithm.

It is next determined whether final compensated DC offset value is obtained (step S36). For example, the final compensated DC offset value may be examined to determine whether the compensated DC offset value is within the range of a minimum value.

When the final compensated DC offset value has not yet been obtained, the present, intermediate, compensated DC offset value is provided to the DAC 140 (step S38). The DAC 140 converts the compensated DC offset value into an analog compensated DC offset signal (VOFF), and provides the analog compensated DC offset signal (VOFF) to the subtractor 114. The subtractor 114 subtracts the analog compensated DC offset signal (VOFF) from the reference voltage VR, and provides the subtraction result to the PGA 116 (step S40). Steps S26~S40 are repeated until a final compensated DC offset value is obtained.

When the final compensated DC offset value is obtained, the final compensated DC offset value is stored in a register (step S42).

When PGA calibration mode ends, the controller 160 changes the CS2 signal to inactive status, the switch SW1 is turned on, and switch SW2 is turned off (step S44). Thus, the input terminal of the PGA 116 is coupled to the external analog input terminal 111.

Therefore, the analog input signal VIN is compensated by the final compensated DC offset value at the subtractor 114, and the difference is input to the input terminal of the PGA 116.

Figure 5:
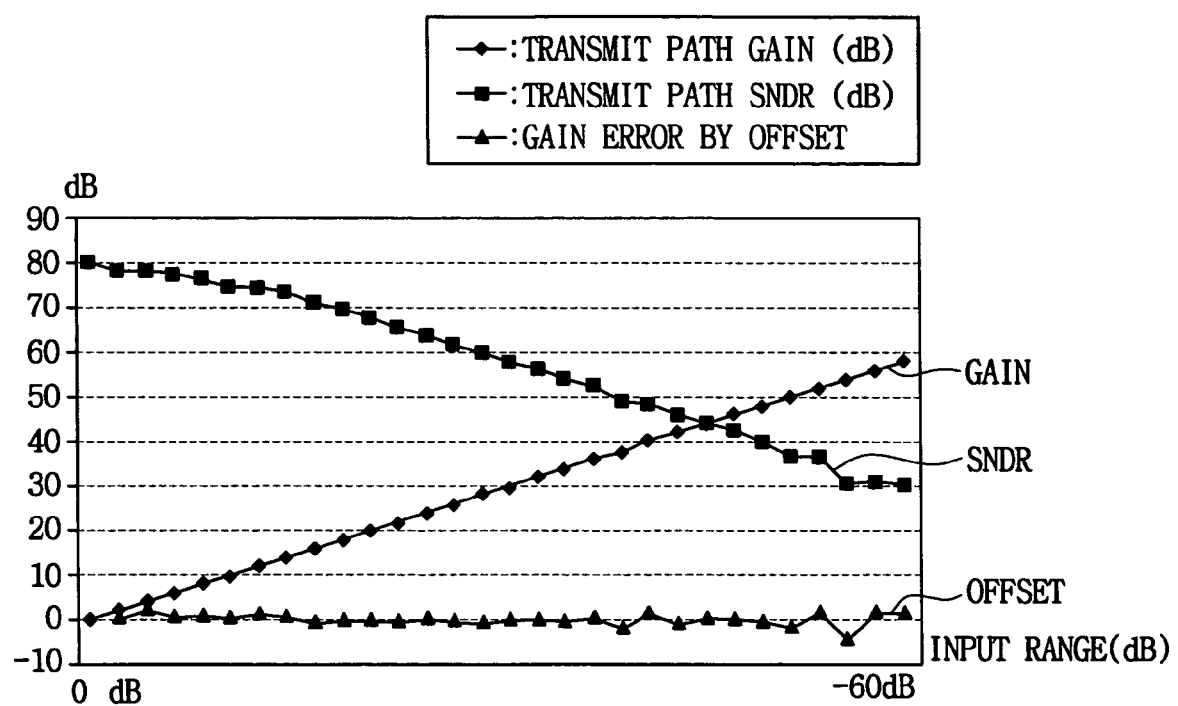
FIG. 5 is a graph depicting the characteristics of the AFE circuit of FIG. 2.

FIG. 5 is a graph illustrating the characteristics of the AFE circuit of FIG. 2.

As shown in FIG. 5, the signal-to-noise ratio (SNDR) is about 80 dB when the gain of the amplifier is 0 dB, and the signal-to-noise ratio (SNDR) is about 30 dB when the gain of the amplifier is about 60 dB. Thus, the SNDR quality is not deteriorated even when the amplitude of the analog input signal is decreased by about 1/1000.

In addition, the offset of the amplifier maintains the same, substantially small, value throughout the entire gain curve. Namely, the amplification effect of the offset of the amplifier is restricted to a minimum.

Although the above exemplary embodiments discuss the calibration (or adjustment) of the internal DC offset of the amplifier and the ADC in the AFE circuit, the above exemplary embodiments could be utilized to substantially remove DC offset of the analog input terminal and various DC offsets that may be generated by other components of the AFE circuit.

According to the above exemplary embodiments of the present invention, the compensation of the DC offset of the amplifier is performed independently of the compensation of the DC offset of the ADC. Thus, DC offsets of each of the PGA amplifier 116 and the ADC 124 may be compensated for precisely.

According to the above exemplary embodiments of the present invention, the DC offset is compensated for using both a digital calibration method and an analog calibration method. Small DC offset is compensated for using the digital calibration method. Large DC offset is compensated for using the analog calibration method. Analog signals are compensated for using analog DC offset values, for example at the first subtractor 114, and digital signals are compensated for using digital DC offset values, for example at the second subtractor 152-2 and/or at the compensation data generator 158.

In addition, the high frequency noises are substantially removed from the compensated DC offset data (digital value) before the compensated DC offset data is fed back to the amplifier so as to reduce DC offset error.

In addition, the digital calibration method or analog calibration method may be selectively chosen, depending on the application.

In addition, the calibration range and the calibration loop counts may be regulated so that the AFE circuit may have enhanced property and reduced power consumption and may perform enhanced DC offset calibration.

While the exemplary embodiments of the present invention and their advantages have been described in detail, it should be understood that various changes, substitutions and alterations may be made herein without departing from the scope of the invention.

What is claimed is:

1. A method of compensating a DC offset in an analog front end circuit having an amplifier and an analog-to-digital converter, the method comprising:

performing a first calibration operation using first data processed by the analog-to-digital converter to obtain estimated DC offset data of the analog-to-digital converter when the analog front end circuit operates in a first mode for calibrating a first DC offset of the analog-to-digital converter;

performing a second calibration operation using second data processed by the analog-to-digital converter and the amplifier, the first DC offset of the analog-to-digital converter being substantially removed from the second data by subtracting the estimated DC offset data of the analog-to-digital converter from the second data so that second compensated DC offset data of the amplifier are obtained, when the analog front end circuit operates in a second mode for calibrating a second DC offset of the amplifier;

iteratively adjusting a value of the second compensated DC offset data of the amplifier to obtain first compensated DC offset data of the amplifier; and transforming the first compensated DC offset data into an analog compensated DC offset signal to subtract the analog compensated DC offset signal from an input signal of the amplifier when the analog front end circuit operates in a third mode.

2. The method of claim 1, wherein the estimated DC offset data of the analog-to-digital converter represents an average value of at least two first data.

3. The method of claim 1, wherein said iteratively adjusting a value of the second compensated DC offset data to obtain first compensated DC offset data of the amplifier comprises:

quantizing the second compensated D.C offset data of the amplifier to generate a sign bit;

generating the first compensated DC offset data of the amplifier based on a value of the sign bit; and repeating the second calibrating operation to generate the first compensated DC offset data of the amplifier so that a value of the first compensated DC offset data of the amplifier is within the range of a minimum value.

4. The method of claim 3, wherein the second calibrating operation is performed using a digital successive approximation algorithm.

5. The method of claim 4, wherein the digital successive approximation algorithm is performed by:

setting an initial value of an n-bit compensation code representing the second compensated DC offset data of the amplifier as initial compensation data, the initial value having a most significant bit; and iteratively changing a value of a successive adjacent next-most-significant bit of the initial compensation data, depending on whether the sign bit has a positive or negative value, until the value of the first compensated DC offset data of the amplifier is within the range of the minimum value.

6. The method of claim 5, wherein the second compensated DC offset data of the amplifier is represented by 2n values such that the second compensated DC offset data of the amplifier has a resolution of 2n, in which n denotes a natural number.

7. The method of claim 6, wherein 2n is greater than or equal to a maximum value of the first compensated DC offset data of the amplifier.

8. The method of claim 1, further comprising low pass filtering the first data in the first mode and low pass filtering the second data in the second mode.

9. A method of compensating for DC offset in an analog front end circuit having an amplifier and an analog-to-digital converter, the method comprising:
   a) low pass filtering data processed by both the analog-to-digital converter and the amplifier to obtain first DC offset data;
   b) removing a DC offset value of the analog-to-digital converter from the first DC offset data to generate second compensated DC offset data;
   c) generating a sign bit based on the second compensated DC offset data;
   d) setting an initial value of an n-bit compensation code representing the second compensated DC offset data of the amplifier as initial compensation data, the initial value having a most significant bit; and
   e) iteratively changing a value of a successive adjacent next-most-significant bit of the initial compensation data, depending on whether the sign bit has a positive or negative value;
   f) converting an approximated DC offset of the amplifier into an analog feed back signal, the approximated DC offset of the amplifier being obtained through step e)
   g) subtracting the analog feed back signal from an input signal of the amplifier; and
   h) repeating step a) through step g) to obtain first compensated DC offset data of the amplifier until a value of the approximated DC offset of the amplifier is within the range of a minimum value.

10. The method of claim 9, wherein said generating a sign bit based on the second compensated DC offset data includes:
   selecting one of the first DC offset data and the second compensated DC offset data; and
   generating the sign bit based on the selected DC offset data.

11. The method of claim 10, wherein the method is automatically performed when a power voltage signal is initially applied to the analog front end circuit.

12. An analog front end circuit comprising:
   an amplifier circuit that is configured to amplify an input signal that is compensated using an analog compensated DC offset signal, the input signal being an analog input signal when the analog front end circuit operates in an operation mode, and the input signal being a first reference voltage signal when the analog front end circuit operates in a calibration mode, the amplifier circuit having a first DC offset;
   an analog-to-digital converter circuit that is configured to convert an output signal of the amplifier circuit into first digital data in the operation mode and to convert a second reference voltage signal into second digital data in the calibration mode, the analog-to-digital converter circuit having a second DC offset;
   a digital low pass filter that is configured to filter an output signal of the analog-to-digital converter circuit to substantially remove high frequency components of the output signal of the analog-to-digital converter circuit;
   a digital-to-analog converter that is configured to convert first compensated DC offset data into the analog compensated DC offset signal to provide the amplifier circuit with the analog compensated DC offset signal; and
   a DC compensator that is configured to select one of the operation mode and the calibration mode, configured to receive an output digital data of the digital low pass filter, and in response to the output digital data of the digital low pass filter, compensating for the first and second DC offsets to generate the first compensated DC offset data, and configured to provide the digital-to-analog converter with the first compensated DC offset data.

13. The analog front end circuit of claim 12, wherein the amplifier circuit includes:
   a first switch that is configured to select the analog input signal in the operation mode and to select the reference voltage signal in the calibration mode;
   a first subtractor that is configured to subtract the analog compensated DC offset signal from an output signal of the first switch; and
   an amplifier that is configured to amplify an output signal of the first subtractor, the amplifier having the first DC offset.

14. The analog front end circuit of claim 13, wherein the amplifier includes a programmable gain amplifier.

15. The analog front end circuit of claim 12, wherein the analog-to-digital converter circuit includes:
   a second switch that is configured to select an output signal of the amplifier in the operation mode and to select a reference voltage signal in the calibration mode; and
   an analog-to-digital converter that is configured to convert an output signal of the second switch into the first or the second digital data.

16. The analog front end circuit of claim 15, wherein the analog-to-digital converter includes a delta-sigma-delta modulator.

17. The analog front end circuit of claim 12, wherein the DC offset compensator includes:
   a quantizer that is configured to quantize the output digital data of the digital low pass filter to generate a sign bit;
   a compensation data generator that is configured to generate the first compensated DC offset data based on the sign bit; and
   a controller that is configured to control the amplifier circuit and the analog-to-digital converter circuit so that the amplifier circuit and the analog-to-digital converter circuit select one of the operation mode and the calibration mode.

18. The analog front end circuit of claim 17, wherein the DC offset compensation circuit further includes:
   an ADC DC offset generator that is configured to extract the second DC offset of the analog-to-digital converter circuit from the output digital data of the digital low pass filter, and configured to estimate the second DC offset of the analog-to-digital converter circuit to generate estimated DC offset data of the analog-to-digital converter circuit;
   a second subtractor that is configured to substantially remove the second DC offset of the analog-to-digital converter, circuit from the output digital data of the digital low pass filter by subtracting the estimated DC offset data from the output digital data of the digital low pass filter to generate second compensated DC offset data; and
   a third switch that is configured to select one of the output digital data of the digital low pass filter and the second compensated DC offset data to provide the compensation data generator with the output digital data of the digital low pass filter or the second compensated DC offset data.

19. The analog front end circuit of claim 18, wherein the estimated DC offset data output from the ADC DC offset generator represents an average value of at least two output digital data of the digital low pass filter.

20. The analog front end circuit of claim 17, wherein the compensation data generator sets an initial value of a n-bit compensation code representing second compensated DC offset data of the amplifier as initial compensation data, the initial value having a most significant bit; and iteratively changes a value of a successive adjacent next-most-significant bit of the initial compensation data, depending on whether the sign bit has a positive or negative value, until the value of the DC offset of the amplifier is within the range of a minimum value.

* * * * *

UNITED STATES PATENT AND TRADEMARK OFFICE
CERTIFICATE OF CORRECTION

PATENT NO. : 6,985,098 B2  Page 1 of 1
DATED : January 10, 2006
INVENTOR(S) : Yong-Hee Lee It is certified that error appears in the above-identified patent and that said Letters Patent is hereby corrected as shown below:

Column 12,
Line 36, delete "." between "D" and "C".

Column 14,
Line 59, delete "," after "converter".

Signed and Sealed this

Ninth Day of May, 2006

JON W. DUDAS
*Director of the United States Patent and Trademark Office*